US012777867B2

(12) United States Patent
Tsai et al.

(10) Patent No.: US 12,777,867 B2
(45) Date of Patent: Oct. 27, 2026

(54) MANUFACTURING METHOD OF SEMICONDUCTOR STRUCTURE

(71) Applicant: UNITED MICROELECTRONICS CORP., Hsin-Chu City (TW)

(72) Inventors: Fu-Shou Tsai, Keelung City (TW); Yu-Lung Shih, Tainan City (TW); Yang-Ju Lu, Changhua County (TW); Ching-Yang Chuang, Pingtung County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 189 days.

(21) Appl. No.: 18/926,351

(22) Filed: Oct. 25, 2024

(65) Prior Publication Data

US 2026/0123319 A1 Apr. 30, 2026

(51) Int. Cl.
*H10P 52/40* (2026.01)

(52) U.S. Cl.
CPC .................................. *H10P 52/403* (2026.01)

(58) Field of Classification Search
None
See application file for complete search history.

(56) References Cited

U.S. PATENT DOCUMENTS 7,372,160 B2 5/2008 Spinner, III
8,828,875 B1 * 9/2014 Lu ............................ C09G 1/02 438/692
2006/0240221 A1 10/2006 Ramarajan
2014/0162446 A1 * 6/2014 Lin ................... H10D 84/0135 438/585

* cited by examiner

*Primary Examiner* — Roberts P Culbert
(74) *Attorney, Agent, or Firm* — Winston Hsu

(57) ABSTRACT

A manufacturing method of a semiconductor structure includes following steps. A metal layer is formed above a first region and a second region of a semiconductor substrate and includes a recess above the second region. The recess is lower than a top surface of the metal layer above the first region. An oxide layer is formed on the metal layer. The oxide layer is partly formed above the first region and partly formed in the recess. A first CMP step is performed to the oxide layer. A removing rate of the oxide layer in the first CMP step is higher than that of the metal layer. A part of the oxide layer remains in the recess after the first CMP step. A second CMP step is performed after the first CMP step. The metal layer above the first and the second regions are partially removed by the second CMP step.

20 Claims, 10 Drawing Sheets

MANUFACTURING METHOD OF SEMICONDUCTOR STRUCTURE

BACKGROUND OF THE INVENTION

1. Field of the Invention

The present invention relates to a manufacturing method of a semiconductor structure, and more particularly, to a manufacturing method of a semiconductor structure including a chemical mechanical polishing step performed to a metal layer.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Generally, poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional poly-silicon gate to be the control electrode. Generally, metal gate stack structures including a low resistivity metal material, the work function metal, and the high-k gate dielectric layer are formed by a replacement metal gate (RMG) process. The quality of the metal gate and the operation performance of the corresponding semiconductor device may be directly influenced by the RMG process.

SUMMARY OF THE INVENTION

A manufacturing method of a semiconductor structure is provided in the present invention. An oxide layer is formed on a metal layer before a chemical mechanical polishing step for reducing height differences between the metal layers located above different regions after the chemical mechanical polishing step.

According to an embodiment of the present invention, a manufacturing method of a semiconductor structure is provided. The manufacturing method includes the following steps. A semiconductor substrate is provided, and the semiconductor substrate includes a first region and a second region. A metal layer is formed above the first region and the second region of the semiconductor substrate. The metal layer includes a recess located above the second region, and the recess is lower than a top surface of the metal layer located above the first region in a vertical direction. An oxide layer is formed on the metal layer, and the oxide layer is partly formed above the first region and partly formed in the recess. A first chemical mechanical polishing (CMP) step is performed to the oxide layer. A removing rate of the oxide layer in the first CMP step is higher than a removing rate of the metal layer in the first CMP step, and at least a part of the oxide layer remains in the recess after the first CMP step.

A second CMP step is performed after the first CMP step, and the metal layer located above the first region and the metal layer located above the second region are partially removed by the second CMP step.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-10 are schematic drawings illustrating a manufacturing method of a semiconductor structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
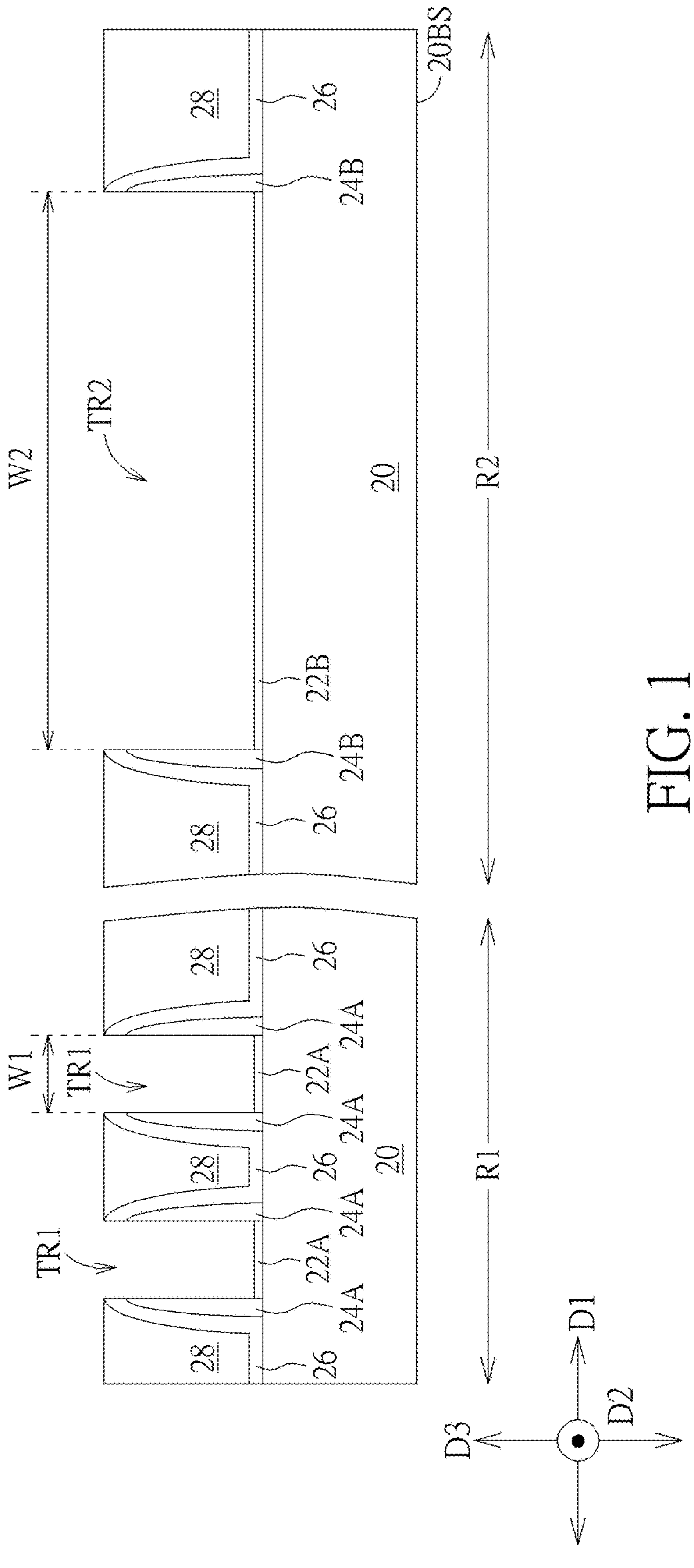
Figure 2:
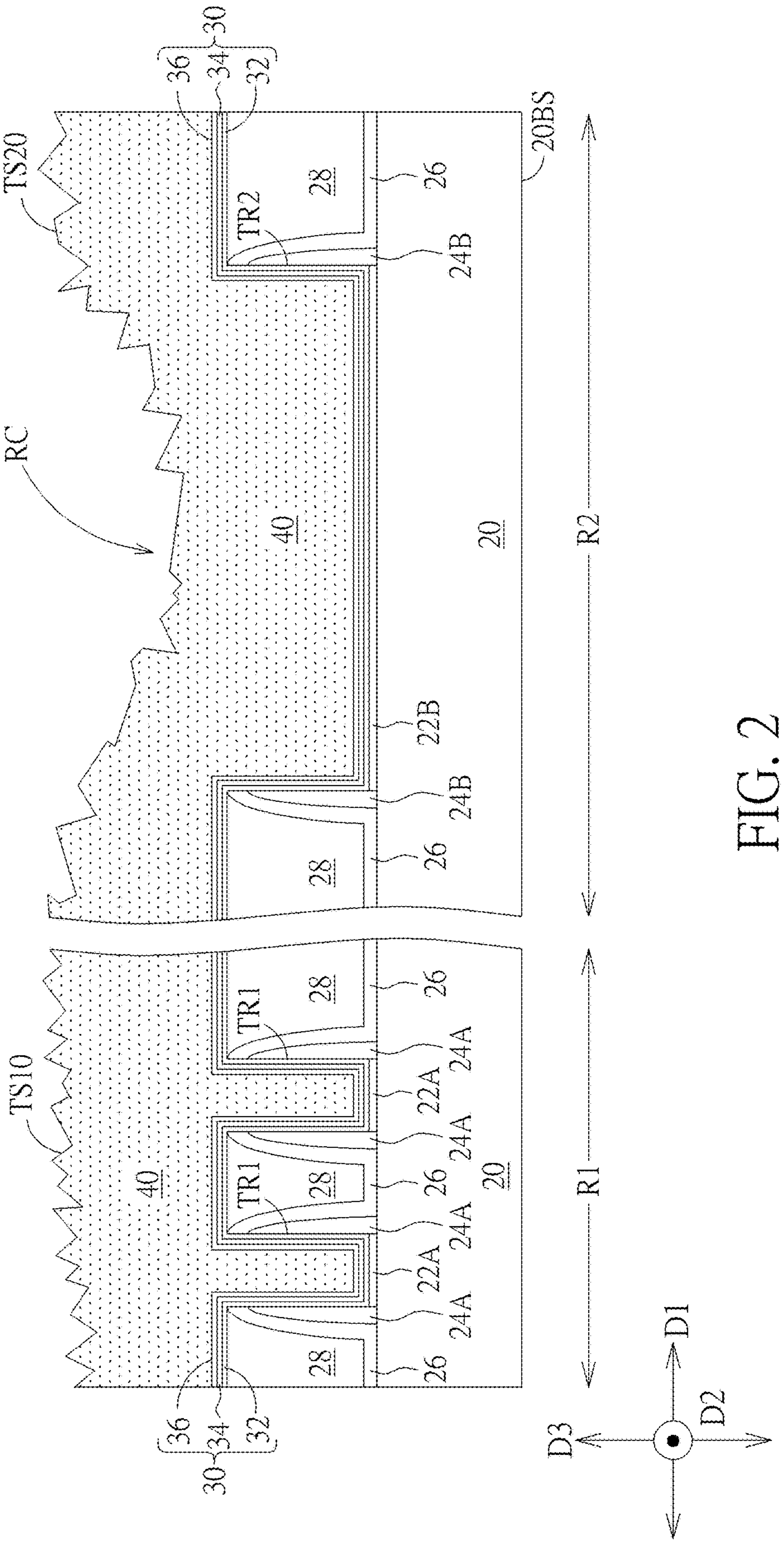
Figure 3:
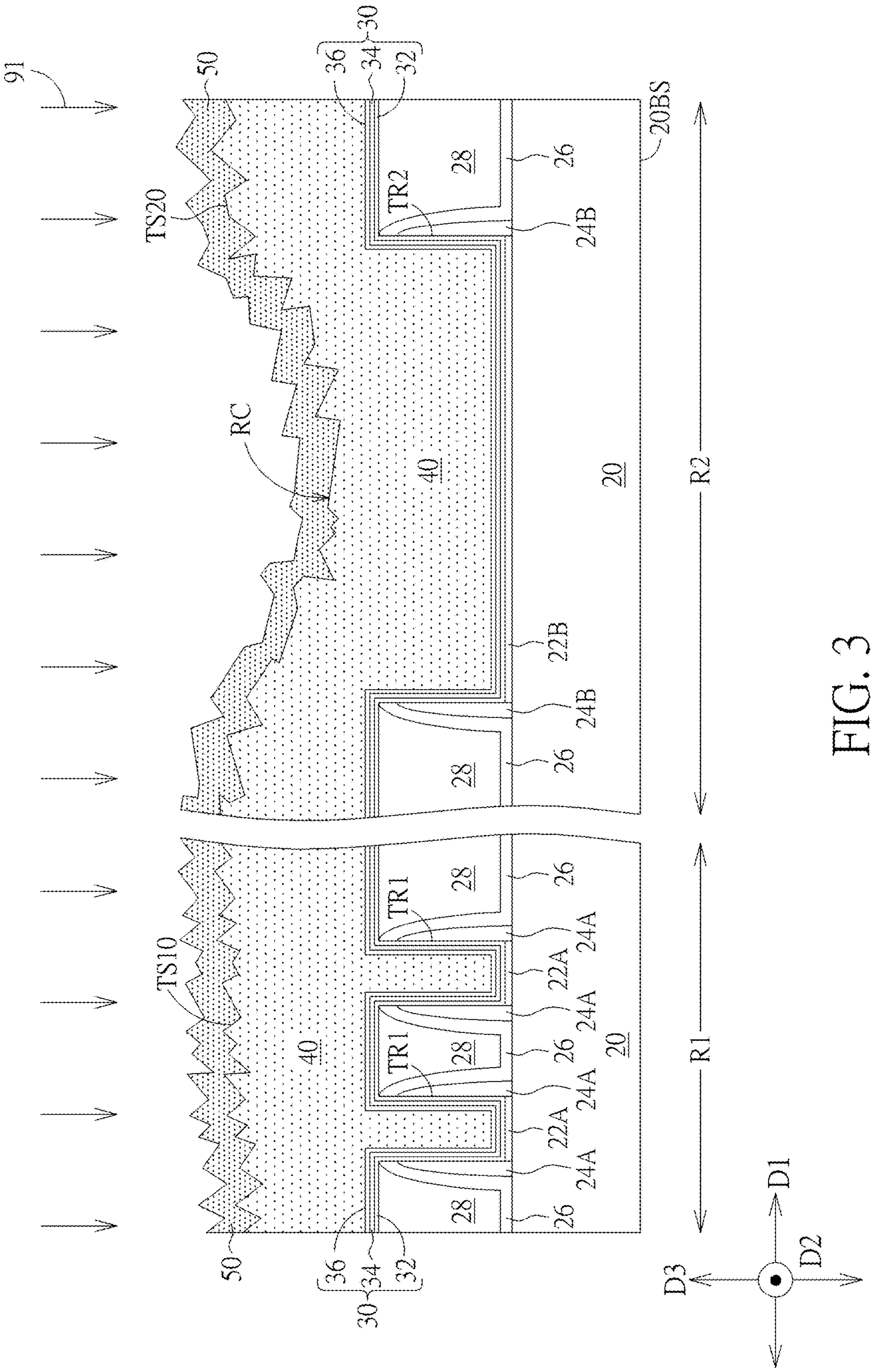
Figure 4:
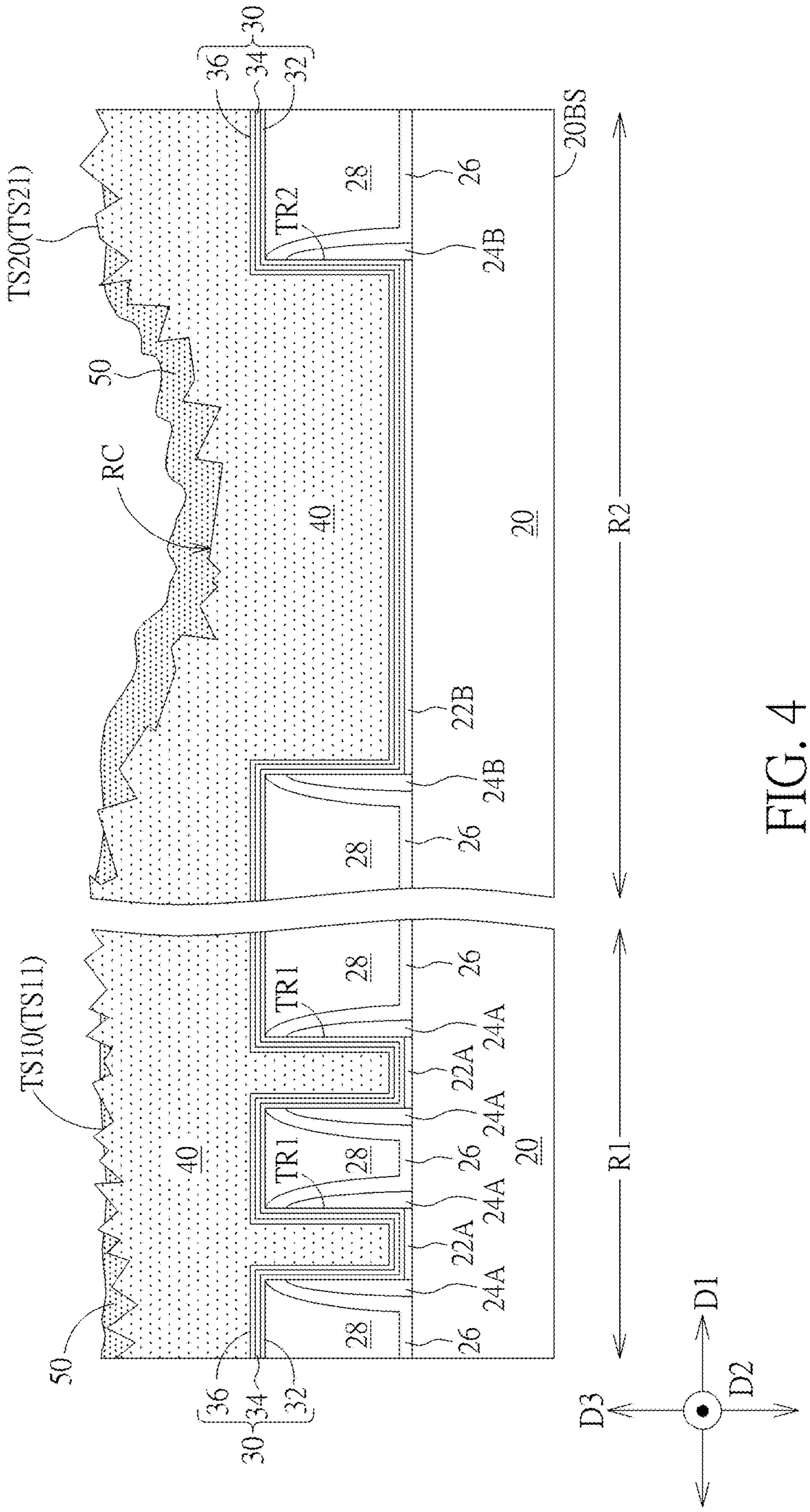
Figure 5:
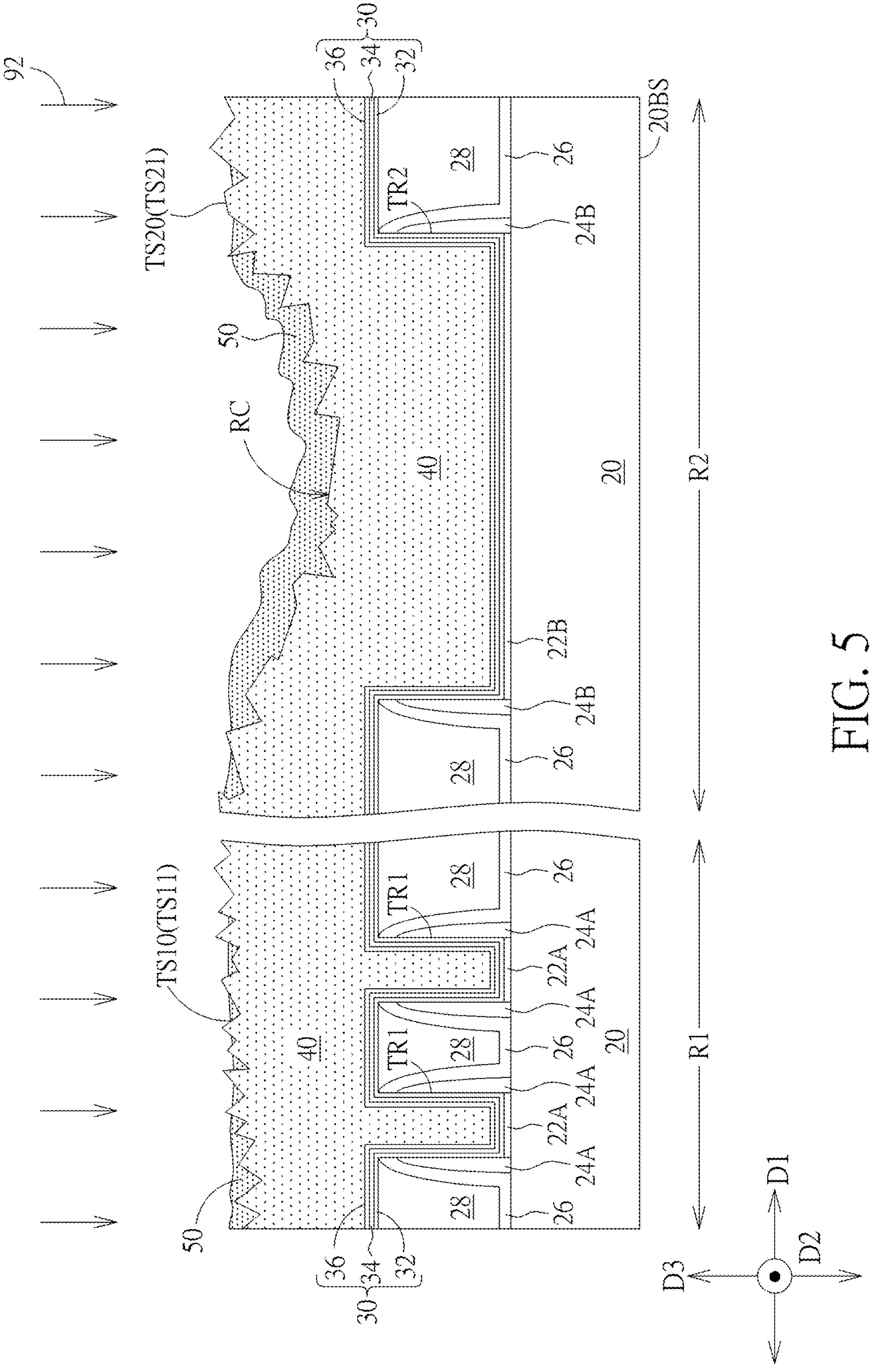
Figure 6:
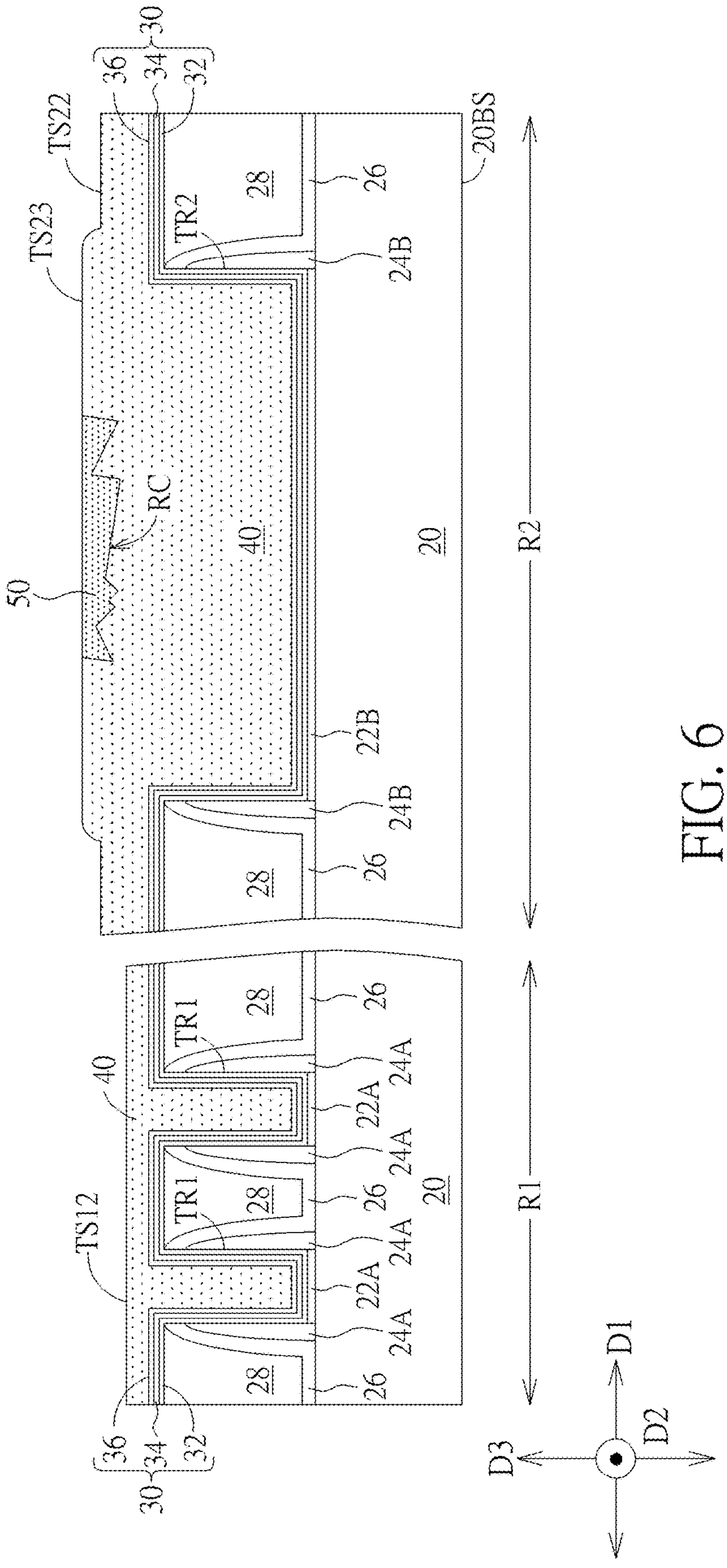
Figure 7:
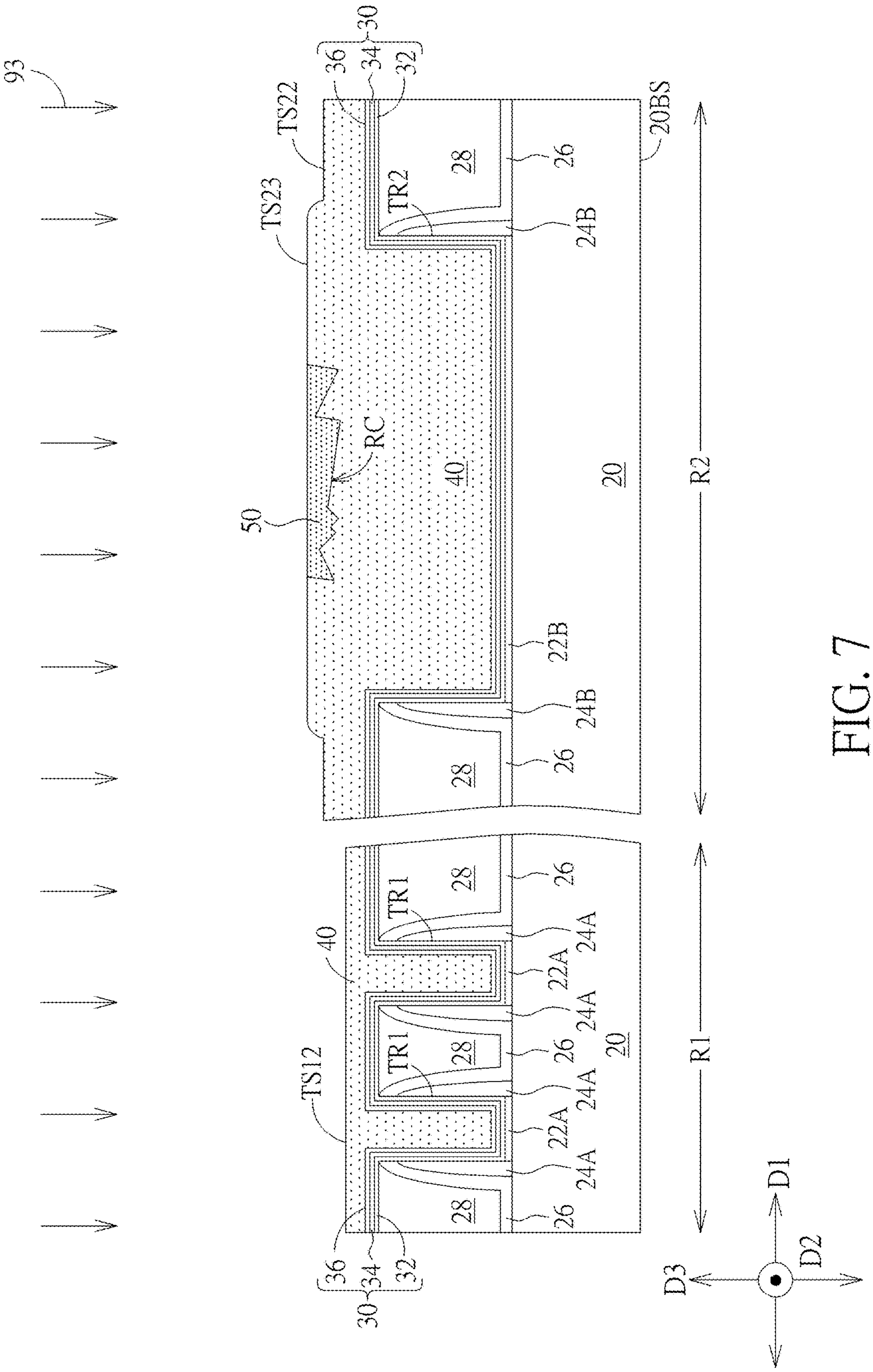
Figure 8:
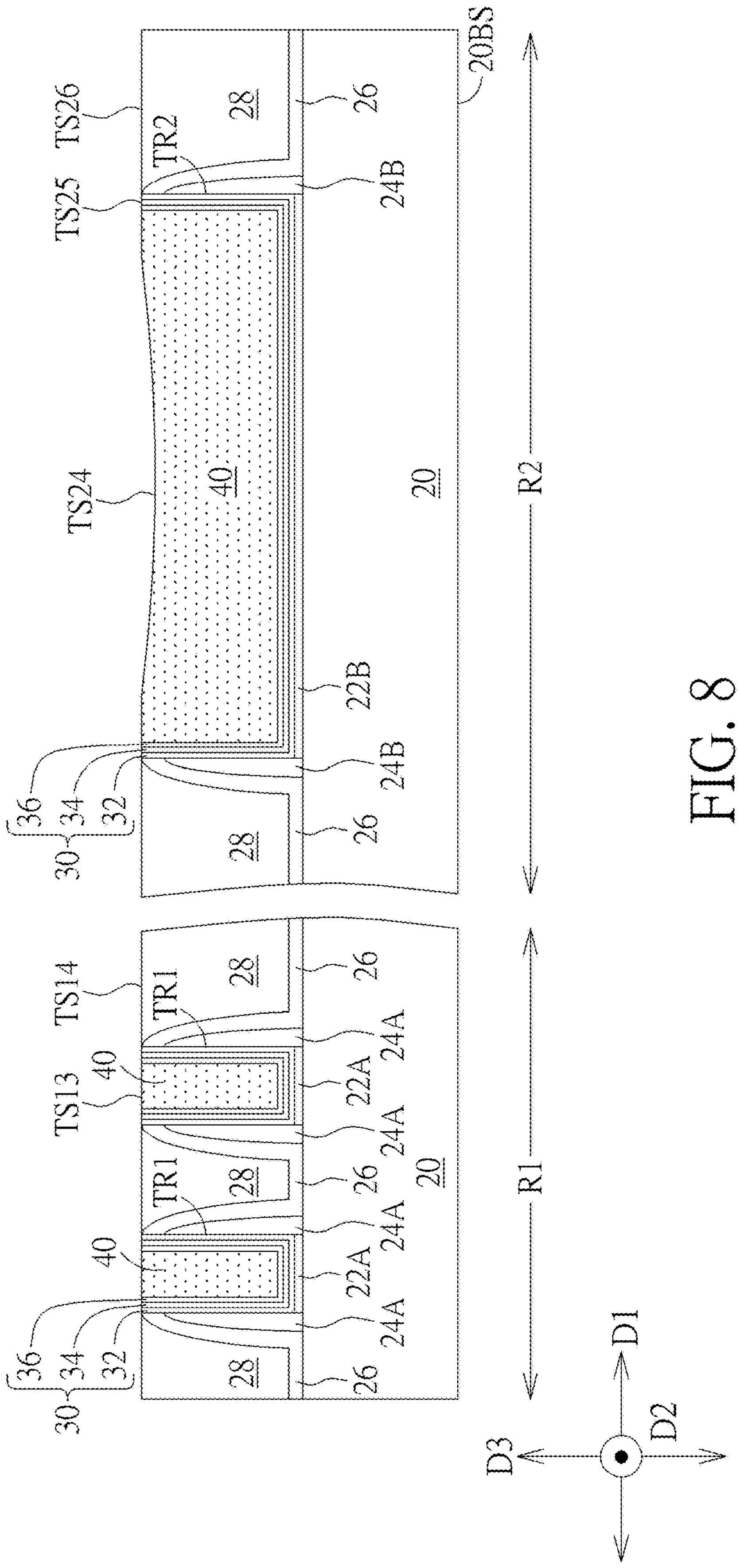
Figure 9:
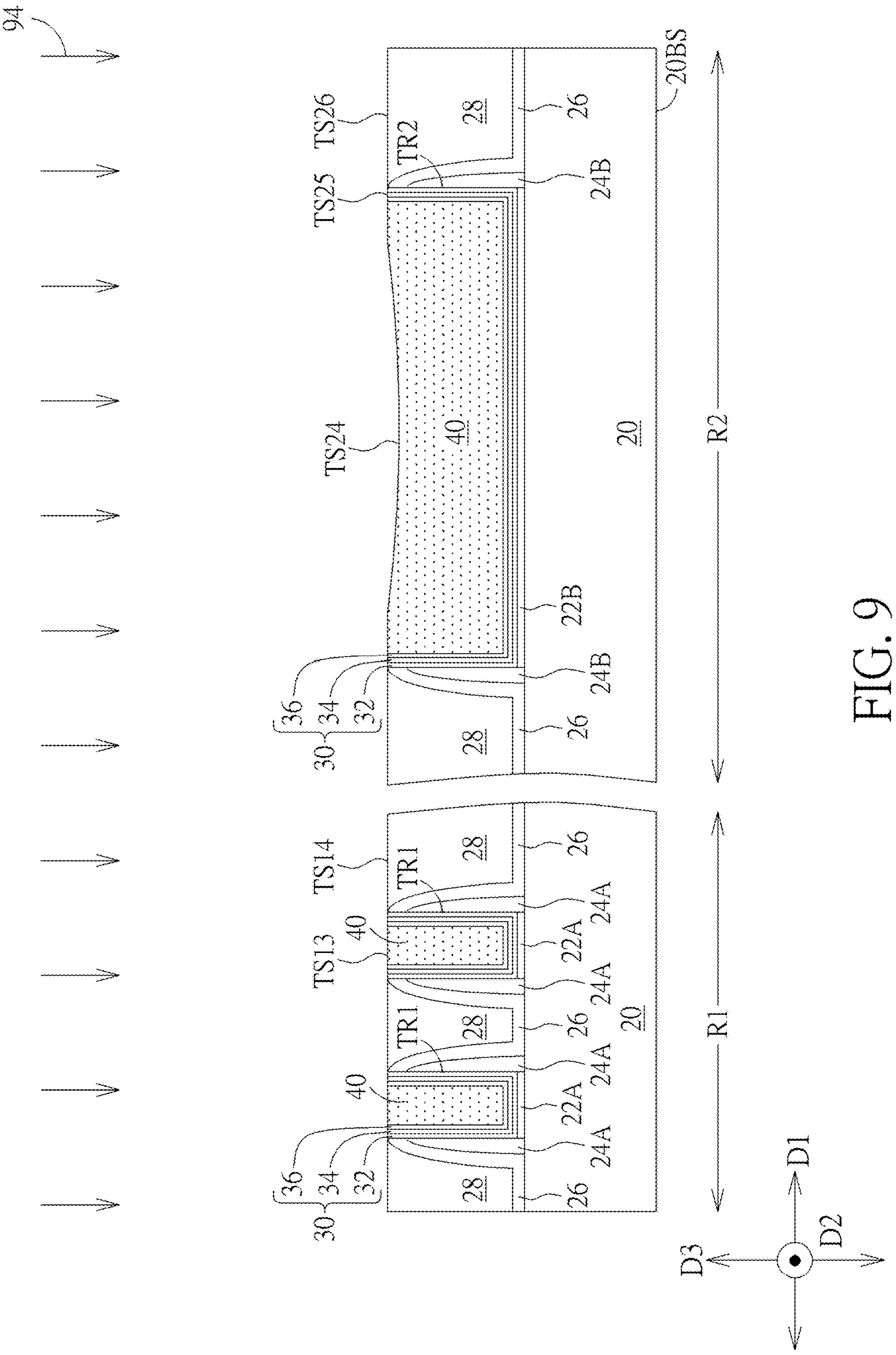
Figure 10:
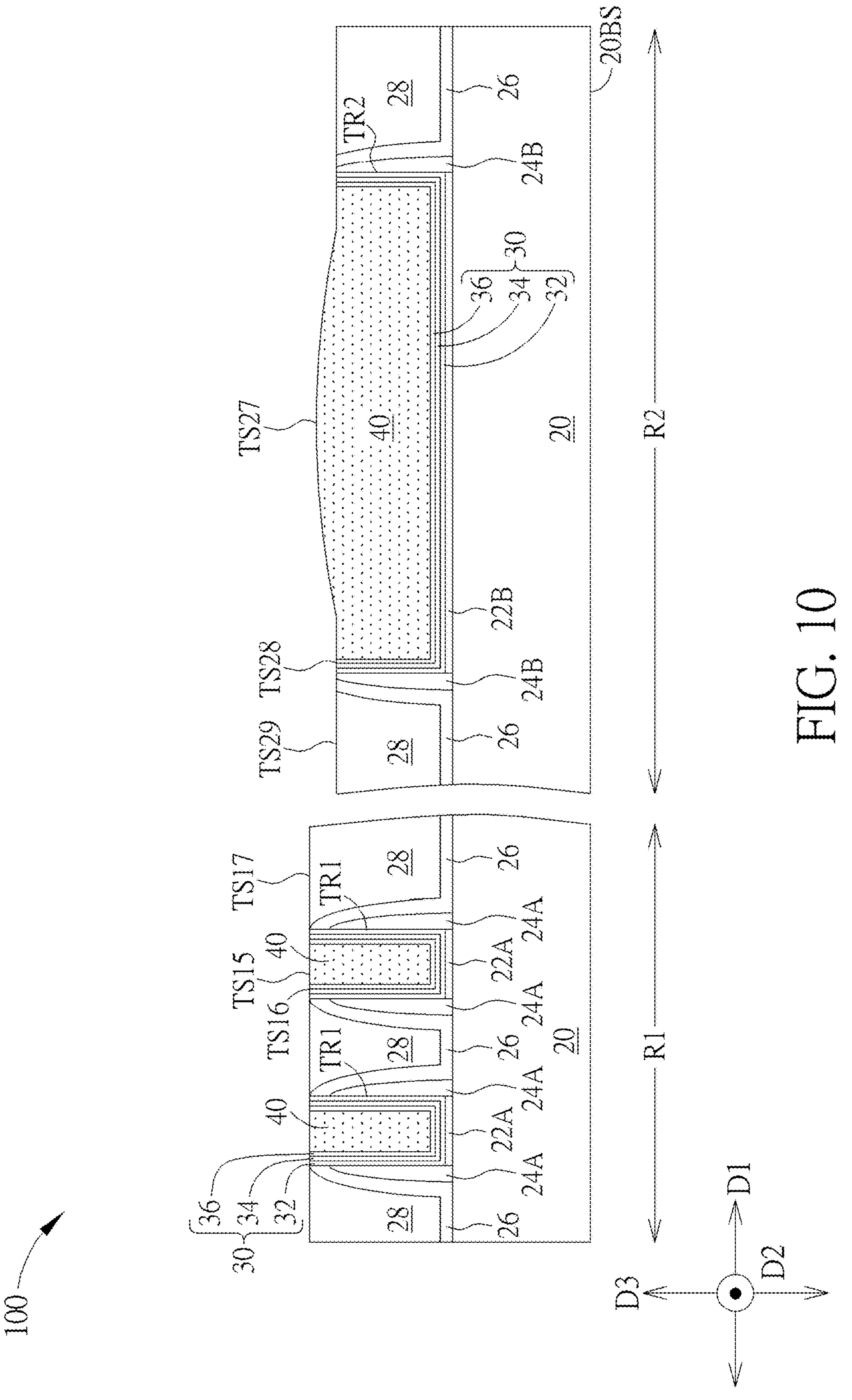

Please refer to FIGS. 1-10. FIGS. 1-10 are schematic drawings illustrating a manufacturing method of a semiconductor structure according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9. The manufacturing method in this embodiment may include the following steps. As shown in FIG. 1, a semiconductor substrate 20 is provided, and the semiconductor substrate 20 includes a first region R1 and a second region R2. As shown in FIG. 2, a metal layer 40 is formed above the first region R1 and the second region R2 of the semiconductor substrate 20. The metal layer 40 includes a recess RC located above the second region R2, and the recess RC is lower than a top surface of the metal layer 40 located above the first region R1 (such as a top surface TS10) in a vertical direction D3. As shown in FIG. 3, an oxide layer 50 is then formed on the metal layer 40, and the oxide layer 50 is partly formed above the first region R1 and partly formed above the second region R2. A part of the oxide layer 50 formed above the second region R2 is formed in the recess RC. As shown in FIG. 3 and FIG. 4, a first chemical mechanical polishing (CMP) step 91 is performed to the oxide layer 50. A removing rate of the oxide layer 50 in the first CMP step 91 is higher than a removing rate of the metal layer 40 in the first CMP step 91. At least a part of the oxide layer 50 remains in the recess RC after the first CMP step 91. As shown in FIGS. 3-6, a second CMP step 92 is performed after the first CMP step 91, and the metal layer 40 located above the first region R1 and the metal layer 40 located above the second region R2 are partially removed by the second CMP step 92. By forming the oxide layer 50 on the metal layer 40 and performing the first CMP step 91 with higher selectivity to the oxide layer 50, the oxide layer 50 may partially remain in the recess RC after the first CMP step 91 for reducing height differences between the metal layer 40 located above the first region R1 and the second region R2 after subsequent CMP steps.

In some embodiments, the vertical direction D3 described above may be regarded as a thickness direction of the semiconductor substrate 20. The semiconductor substrate 20 may have a top surface and a bottom surface 20BS opposite to the top surface in the vertical direction D3. The metal layer 40 and the oxide layer 50 may be formed at a side of the top surface of the semiconductor substrate 20. Horizontal directions substantially orthogonal to the vertical direction D3 (such as a horizontal direction D1 and/or a horizontal direction D2) may be substantially parallel with the top surface and/or the bottom surface 20BS of the semiconductor substrate 20, but not limited thereto. In this description, a distance between the bottom surface 20BS of the semiconductor substrate 20 and a relatively higher location and/or a relatively higher part in the vertical direction D3 may be greater than a distance between the bottom surface 20BS of the semiconductor substrate 20 and a relatively lower location and/or a relatively lower part in the vertical direction D3. The bottom or a lower portion of each component may be closer to the bottom surface 20BS of the semiconductor substrate 20 in the vertical direction D3 than the top or upper portion of this component, but not limited thereto. In this description, a top surface of a specific component may include but is not limited to the topmost surface of this component in the vertical direction D3, and a bottom surface of a specific component may include but is not limited to the bottommost surface of this component in the vertical direction D3. Additionally, in this description, the condition that a certain component is disposed between two other components in a specific direction may include but is not limited to a condition that the certain component is sandwiched between the two other components in the specific direction.

Specifically, the manufacturing method in this embodiment may include but is not limited to the following steps. As shown in FIG. 1 an FIG. 2, in some embodiments, before the step of forming the metal layer 40, an interfacial layer 22A, an interfacial layer 22B, a spacer structure 24A, a spacer structure 24B, an etching stop layer 26, and a dielectric layer 28 may be formed on the semiconductor substrate 20. A first trench TR1 may be located above the first region R1 and surrounded by the dielectric layer 28, the etching stop layer 26, and the spacer structure 24A in a horizontal direction (such as the horizontal direction D1 and/or the horizontal direction D2 substantially orthogonal to the horizontal direction D1, and a second trench TR2 may be located above the second region R2 and surrounded by the dielectric layer 28, the etching stop layer 26, and the spacer structure 24B in the horizontal direction D1 and/or the horizontal direction D2. In some embodiments, a plurality of the first trenches TR1 may be formed above the first region R1, a width W2 of the second trench TR2 may be greater than a width W1 each of the first trenches TR1, and a density of the first trenches TR1 located above the first region R1 may be greater than that of the second trench TR2 located above the second region R2. In some embodiments, the width of the trench may be regarded as a length of the trench in the horizontal direction (such as the horizontal direction D1), but not limited thereto. The interfacial layer 22A and the interfacial layer 22B may be formed above the first region R1 and the second region R2, respectively, and the spacer structure 24A and the spacer structure 24B may be formed above the first region R1 and the second region R2, respectively. The etching stop layer 26 may be formed on the spacer structure 24A, the spacer structure 24B, and the semiconductor substrate 20, and the dielectric layer 28 may be formed on the etching stop layer 26 and located above the first region R1 and the second region R2.

In some embodiments, a method of forming the first trench TR and the second trench TR2 may include but is not limited to the following steps. A first dummy gate structure and a second dummy gate structure (not illustrated) may be formed on the interfacial layer 22A and the interfacial layer 22B, respectively, before the step of forming the spacer structures 24A and the spacer structure 24B. The spacer structure 24A may be formed on sidewalls of the first dummy gate structure and the interfacial layer 22A, and the spacer structure 24B may be formed on sidewalls of the second dummy gate structure and the interfacial layer 22B. The etching stop layer 26 may be formed on the first dummy gate structure, the spacer structure 24A, the second dummy gate structure, and the spacer structure 24B, and the dielectric layer 28 may be formed on the etching stop layer 26.

Subsequently, a planarization process (such as a CMP process, an etching back process, or other suitable planarization approaches) may be carried out for removing a part of the dielectric layer 28 and a part of the etching stop layer 26 and exposing the first dummy gate structure and the second dummy gate structure. After the planarization process, the first dummy gate structure and the second dummy gate structure may be removed for forming the first trench TR1 and the second trench TR2, respectively. In some embodiments, the method of forming the first trench TR and the second trench TR2 described above may be regarded as a part of a replacement metal gate (RMG) process, but not limited thereto. In some embodiments, the semiconductor substrate 20 may include fin-shaped structures (not illustrated) located within the first region R1 and the second region R2, and the first trench TR1 and the second trench TR2 may be formed straddling the fin-shaped structures, respectively, but not limited thereto.

In some embodiments, the semiconductor substrate 20 may include a silicon substrate, an epitaxial silicon substrate, a silicon germanium substrate, a silicon carbide substrate, a silicon-on-insulator (SOI) substrate, or a substrate made of other suitable semiconductor materials. The interfacial layer 22A and the interfacial layer 22B may include silicon oxide or other suitable dielectric materials. The spacer structure 24A and the spacer structure 24B may respectively include a single layer or multiple layers of insulation materials, such as silicon oxide, silicon nitride, silicon oxynitride, or other suitable insulation materials. The etching stop layer 26 may include silicon nitride or other suitable insulation materials, and the dielectric layer 28 may include silicon oxide or other suitable insulation materials. The first dummy gate structure and the second dummy gate structure described above may include polysilicon or other suitable sacrificial materials.

As shown in FIG. 1 and FIG. 2, the metal layer 40 may be formed after the first trench TR1 and the second trench TR2 are formed, and the metal layer 40 may be partly formed in the first trench TR1 and the second trench TR2 and partly formed outside the first trench TR1 and the second trench TR2. The recess RC is located above the second trench TR2 in the vertical direction D3, and the recess RC may be formed because of the influence of the second trench TR2 with the greater dimension. The recess RC may be located directly above the second trench TR2 in the vertical direction D3, and the recess RC (such as the bottom of the recess RC) may be lower than a top surface of the metal layer 40 located above the second region R2 and located directly above the dielectric layer 28 in the vertical direction D3 (such as a top surface TS20) and the top surface TS10 of the metal layer 40 located above the first region R1 in the vertical direction D3. The metal layer 40 may include tungsten, copper, or other suitable metal materials with relatively low electrical resistivity, and the top surface of the metal layer 40 may be a rough because of the formation property of the metal layer 40, but not limited thereto.

In some embodiments, a lamination structure 30 may be formed above the first region R1 and the second region R2 of the semiconductor substrate 20 before the metal layer 40 is formed. The lamination structure 30 may be partly formed in the first trench TR1 and the second trench TR2 and partly formed outside the first trench TR1 and the second trench TR2, and the metal layer 40 may be formed on the lamination structure 30. The lamination structure 30 may be formed conformally on the inner surfaces of the first trench TR1 and the second trench TR2 and the top surfaces of the dielectric layer 28 and the etching stop layer 26. In some embodiments, the lamination structure 30 may include a gate dielectric layer 32, a work function layer 36 disposed on the gate dielectric layer 32, and a barrier layer 34 disposed between the gate dielectric layer 32 and the work function layer 36. The lamination structure 30 may further include other material layers (such as another work function layer and/or another barrier layer) according to some design considerations. The gate dielectric layer 32 may include a high dielectric constant (high-k) dielectric layer or other suitable dielectric materials, the barrier layer 34 may include tantalum nitride, titanium nitride, or other suitable electrical conductive barrier materials, and the work function layer 36 may include a single layer or multiple layers of work function materials, such as tantalum nitride, titanium nitride, titanium carbide, titanium aluminide, titanium aluminum carbide, or other suitable n-type and/or p-type work function materials. The metal layer 40 may directly contact the lamination structure 30, and the gate dielectric layer 32 may directly contact the interfacial layer 22A and the interfacial layer 22B, but not limited thereto.

As shown in FIG. 3, the oxide layer 50 may be formed by a deposition process (such as a chemical vapor deposition process, but not limited thereto), and the oxide layer 50 may be formed conformally on and directly contact the metal layer 40. The oxide layer 50 is thinner than the metal layer 40, and a thickness of the oxide layer 50 may range from 50 angstroms to 100 angstroms, but not limited thereto. The oxide layer 50 may include silicon oxide or other suitable oxide materials. As shown in FIG. 3 and FIG. 4, the first CMP step 91 with higher selectivity to the oxide layer 50 may be performed, the first CMP step 91 may stop at the metal layer 40, and at least a part of the metal layer 40 located above the first region R1 and a part of the metal layer 40 located above the second region R2 may be exposed by the first CMP step 91. In some embodiments, the top surface TS10 of the metal layer 40 located above the first region R1 and a top surface TS20 of the metal layer 40 located above the second region R2 may be exposed after the first CMP step 91. In some embodiments, a part of the metal layer 40 may be removed by the first CMP step 91, and the exposed surface of the metal layer 40 located above the first region R1 and the exposed surface of the metal layer 40 located above the second region R2 may be regarded as a top surface TS11 and a top surface TS21, respectively, but not limited thereto. As shown in FIG. 3 and FIG. 4, some of the oxide layer 50 may remain above the first region R1 after the first CMP step 91, but the amount of the oxide layer 50 remaining above the second region R2 after the first CMP step 91 (such as the oxide layer 50 remaining in the recess RC) is significantly greater than that of the oxide layer 50 remaining above the first region R1 after the first CMP step 91. In some embodiments, a ratio of the removing rate of the oxide layer 50 in the first CMP step 91 to the removing rate of the metal layer 40 in the first CMP step 91 may range from 10:1 to 30:1, and the ratio may be about 20:1 preferably, but not limited thereto. The ratio of the removing rate of the oxide layer 50 in the first CMP step 91 to the removing rate of the metal layer 40 in the first CMP step 91 may be regarded as selectivity between the oxide layer 50 and the metal layer 40 in the first CMP step 91, and the first CMP step 91 may be regarded as a CMP step with higher selectivity to the oxide layer 50. In this description, the removing rate in the CMP step may be regarded as an instantaneous removing rate rather than an average removing rate within the whole process time of the CMP step, but not limited thereto.

As shown in FIG. 5 and FIG. 6, the second CMP step 92 may be performed for partially removing the metal layer 40 located above the first region R1 and the metal layer 40 located above the second region R2. A removing rate of the metal layer 40 in the second CMP step 92 is higher than a removing rate of the oxide layer 50 in the second CMP step 92. In some embodiments, a ratio of the removing rate of the metal layer 40 in the second CMP step 92 to the removing rate of the oxide layer 50 in the second CMP step 92 may range from 30:1 to 50:1, and the ratio may be about 40:1 preferably, but not limited thereto. The ratio of the removing rate of the metal layer 40 in the second CMP step 92 to the removing rate of the oxide layer 50 in the second CMP step 92 may be regarded as selectivity between the metal layer 40 and the oxide layer 50 in the second CMP step 92, and the second CMP step 92 may be regarded as a CMP step with higher selectivity to the metal layer 40. In some embodiments, the oxide layer 50 remaining above the first region R1 may be completely removed by the second CMP step 92, and a part of the oxide layer 50 located above the second region R2 may still remain in the recess RC after the second CMP step 92, but not limited thereto. A part of the metal layer 40 located above the first region R1 may remain outside the first trench TR1 after the second CMP step 92, and a part of the metal layer 40 located above the second region R2 may remain outside the second trench TR2 after the second CMP step 92. A top surface TS23 of the metal layer 40 located directly above the second trench TR2 in the vertical direction D3 after the second CMP step 92 may be higher than a top surface TS22 of the metal layer 40 located above the second region R2 and located directly above the dielectric layer 28 in the vertical direction D3 after the second CMP step 92. The top surface of the metal layer 40 located above the second region R2 after the second CMP step 92 (such as the top surface TS23 and the top surface TS22) may be higher than a top surface TS12 of the metal layer 40 located above the first region R1 after the second CMP step 92 in the vertical direction D3.

As shown in FIGS. 5-8, a third CMP step 93 may be performed after the second CMP step 92. The oxide layer 50 (such as the oxide layer 50 remaining in the recess RC after the second CMP step 92), the metal layer 40 located above the first region R1 and located outside the first trench TR1, the lamination structure 30 located above the first region R1 and located outside the first trench TR1, the metal layer 40 located above the second region R2 and located outside the second trench TR2, and the lamination structure 30 located above the second region R2 and located outside the second trench TR2 may be removed by the third CMP step 93. A top surface TS14 of the dielectric layer 28 located above the first region R1 and a top surface TS26 of the dielectric layer 28 located above the second region R2 may be exposed after the third CMP step 93. A top surface TS24 of the metal layer 40 located above the second region R2 (such as the metal layer 40 located in the second trench TR2) after the third CMP step 93 may be lower than a top surface TS13 of the metal layer 40 located above the first region R1 (such as the metal layer 40 located in the first trench TR1) after the third CMP step 93 in the vertical direction D3, and the top surface TS24 of the metal layer 40 located above the second region R2 after the third CMP step 93 may include a concave surface. The top surface TS24 of the metal layer 40 may be regarded as a top surface of the metal layer 40 located in the second trench TR2 after the third CMP step 93, the top surface TS24 may be lower than a top surface TS25 of the lamination structure 30 located in the second trench TR2 after the third CMP step 93 and the top surface TS26 of the dielectric layer 28 located above the second region R2 after the third CMP step 93. In other words, the dishing may still occur after the third CMP step 93 especially when the second trench TR2 is relatively large, but the dishing issue may be improved by the manufacturing method described above. For instance, the distance between the top surface TS24 and the top surface TS26 in the vertical direction D3 and/or the distance between the top surface TS24 and the top surface TS13 in the vertical direction D3 may be reduced by the manufacturing method described above.

In some embodiments, a material composition of the dielectric layer 28 may be identical or similar to that of the oxide layer 50, but not limited thereto. A removing rate of the metal layer 40 in the third CMP step 93 may be higher than a removing rate of the oxide layer 50 in the third CMP step 93 (or a removing rate of the dielectric layer 28 in the third CMP step 93). A ratio of the removing rate of the metal layer 40 in the third CMP step 93 to the removing rate of the oxide layer 50 in the third CMP step 93 (or the removing rate of the dielectric layer 28 in the third CMP step 93) may range from 30:1 to 50:1, and the ratio may be about 40:1 preferably, but not limited thereto. The ratio of the removing rate of the metal layer 40 in the third CMP step 93 to the removing rate of the oxide layer 50 in the third CMP step 93 (or the removing rate of the dielectric layer 28 in the third CMP step 93) may be regarded as selectivity between the metal layer 40 and the oxide layer 50 in the third CMP step 93 (or selectivity between the metal layer 40 and the oxide layer 50 in the third CMP step 93), and the third CMP step 93 may be regarded as a CMP step with higher selectivity to the metal layer 40. In some embodiments, the second CMP step 92 may be used to remove the bulk of the metal layer 40 located outside the first trench TR1 and the second trench TR2, and the polishing pad used in the second CMP step 92 may be different from the polishing pad used in the third CMP step 93 for enhancing the rate of removing the metal layer 40, but not limited thereto.

As shown in FIGS. 7-10, a fourth CMP step 94 may be performed to the metal layer 40, the lamination structure 30, the dielectric layer 28, the etching stop layer 26, the spacer structure 24A, and the spacer structure 24B after the third CMP step 93. A removing rate of the metal layer 40 in the fourth CMP step 94 is lower than a removing rate of an oxide material in the fourth CMP step 94 (such as a removing rate of the dielectric layer 28 in the fourth CMP step 94). A ratio of the removing rate of the metal layer 40 in the fourth CMP step 94 to the removing rate of the oxide material in the fourth CMP step 94 (such as the removing rate of the dielectric layer 28 in the fourth CMP step 94) may range from 0.2:1 to 0.8:1, and the ratio may be about 0.5:1 preferably, but not limited thereto. The ratio of the removing rate of the metal layer 40 in the fourth CMP step 94 to the removing rate of the oxide material in the fourth CMP step 94 (such as the removing rate of the dielectric layer 28 in the fourth CMP step 94) may be regarded as selectivity between the metal layer 40 and the dielectric layer 28 in the fourth CMP step 94, and the fourth CMP step 94 may be regarded as a CMP step with higher selectivity to the dielectric layer 28, but not limited thereto. In some embodiments, the slurry used in the fourth CMP step 94 may be different from the slurry used in the third CMP step 93, but not limited thereto.

The metal layer 40 located above the second region R2 may be partially removed by the fourth CMP step 94, and a top surface TS27 of the metal layer 40 located above the second region R2 after the fourth CMP step 94 may be higher than a top surface TS28 of the lamination structure 30 located above the second region R2 after the fourth CMP step 94 and a top surface TS29 of the dielectric layer 28 located above the second region R2 after the fourth CMP step 94 in the vertical direction D3 because of the fourth CMP step 94 with the selectivity described above. In some embodiments, the top surface TS27 of the metal layer 40 located above the second region R2 after the fourth CMP step 94 may include a convex surface, and the top surface TS27 of the metal layer 40 located above the second region R2 after the fourth CMP step 94 may be slightly lower than a top surface TS15 of the metal layer 40 located above the first region R1 after the fourth CMP step 94 in the vertical direction D3. The top surface TS29 of the dielectric layer 28 located above the second region R2 after the fourth CMP step 94 may be lower than a top surface TS17 of the dielectric layer 28 located above the first region R1 after the fourth CMP step 94 in the vertical direction D3, and the top surface TS28 of the lamination structure 30 located above the second region R2 after the fourth CMP step 94 may be lower than a top surface TS16 of the lamination structure 30 located above the first region R1 after the fourth CMP step 94 in the vertical direction D3.

By the manufacturing method described above, a semiconductor structure 100 illustrated in FIG. 10 may be obtained, the height difference between the metal layer 40 located in the first trench TR1 and the metal layer 40 located in the second trench TR2 may be reduced, and that is beneficial to subsequent processes performed to the semiconductor structure 100. In some embodiment, subsequent processes may be performed to the semiconductor structure 100 for forming a first gate structure including at least a part of the metal layer 40 and at least a part of the lamination structure 30 above the first region R1 and forming a second gate structure including at least a part of the metal layer 40 and at least a part of the lamination structure 30 above the second region R2. The first gate structure and the second gate structure may be gate structures in different semiconductor devices (such as different field effect transistors), and the manufacturing yield of the gate structures may be improved by the manufacturing method described above, but not limited thereto.

To summarize the above descriptions, according to the manufacturing method of the semiconductor structure in the present invention, by forming the oxide layer on the metal layer and performing the first CMP step with higher selectivity to the oxide layer, the oxide layer may partially remain in the recess of the metal layer after the first CMP step for reducing the height differences between the metal layer located above the first region and the second region after the subsequent CMP steps. The related manufacturing yield may be improved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:

providing a semiconductor substrate comprising a first region and a second region;

forming a metal layer above the first region and the second region of the semiconductor substrate, wherein the metal layer comprises a recess located above the second region, and the recess is lower than a top surface of the metal layer located above the first region in a vertical direction;

forming an oxide layer on the metal layer, wherein the oxide layer is partly formed above the first region and partly formed in the recess;

performing a first chemical mechanical polishing (CMP) step to the oxide layer, wherein a removing rate of the oxide layer in the first CMP step is higher than a removing rate of the metal layer in the first CMP step, and at least a part of the oxide layer remains in the recess after the first CMP step; and performing a second CMP step after the first CMP step, wherein the metal layer located above the first region and the metal layer located above the second region are partially removed by the second CMP step.

2. The manufacturing method of the semiconductor structure according to claim 1, wherein the first CMP step stops at the metal layer, and at least a part of the metal layer located above the first region is exposed by the first CMP step.

3. The manufacturing method of the semiconductor structure according to claim 1, wherein a ratio of the removing rate of the oxide layer in the first CMP step to the removing rate of the metal layer in the first CMP step ranges from 10:1 to 30:1.

4. The manufacturing method of the semiconductor structure according to claim 1, wherein a removing rate of the metal layer in the second CMP step is higher than a removing rate of the oxide layer in the second CMP step.

5. The manufacturing method of the semiconductor structure according to claim 4, wherein a ratio of the removing rate of the metal layer in the second CMP step to the removing rate of the oxide layer in the second CMP step ranges from 30:1 to 50:1.

6. The manufacturing method of the semiconductor structure according to claim 1, further comprising:

forming a dielectric layer on the semiconductor substrate before the metal layer is formed, wherein a first trench is located above the first region and surrounded by the dielectric layer in a horizontal direction, a second trench is located above the second region and surrounded by the dielectric layer in the horizontal direction, and a width of the second trench is greater than a width of the first trench, wherein the metal layer is partly formed in the first trench and the second trench and partly formed outside the first trench and the second trench, and the recess is located above the second trench in the vertical direction.

7. The manufacturing method of the semiconductor structure according to claim 6, further comprising:

forming a lamination structure above the first region and the second region of the semiconductor substrate before the metal layer is formed, wherein the lamination structure is partly formed in the first trench and the second trench and partly formed outside the first trench and the second trench, and the metal layer is formed on the lamination structure.

8. The manufacturing method of the semiconductor structure according to claim 7, wherein the lamination structure comprises a gate dielectric layer and a work function layer disposed on the gate dielectric layer.

9. The manufacturing method of the semiconductor structure according to claim 7, wherein a part of the metal layer located above the first region remains outside the first trench after the second CMP step, a part of the metal layer located above the second region remains outside the second trench after the second CMP step, and a top surface of the metal layer located above the second region after the second CMP step is higher than a top surface of the metal layer located above the first region after the second CMP step in the vertical direction.

10. The manufacturing method of the semiconductor structure according to claim 9, further comprising:

performing a third CMP step after the second CMP step, wherein the metal layer located above the first region and located outside the first trench, the lamination structure located above the first region and located outside the first trench, the metal layer located above the second region and located outside the second trench, and the lamination structure located above the second region and located outside the second trench are removed by the third CMP step.

11. The manufacturing method of the semiconductor structure according to claim 10, wherein a removing rate of the metal layer in the third CMP step is higher than a removing rate of the oxide layer in the third CMP step.

12. The manufacturing method of the semiconductor structure according to claim 11, wherein a ratio of the removing rate of the metal layer in the third CMP step to the removing rate of the oxide layer in the third CMP step ranges from 30:1 to 50:1.

13. The manufacturing method of the semiconductor structure according to claim 10, wherein a top surface of the metal layer located above the second region after the third CMP step is lower than a top surface of the metal layer located above the first region after the third CMP step in the vertical direction, and the top surface of the metal layer located above the second region after the third CMP step comprises a concave surface.

14. The manufacturing method of the semiconductor structure according to claim 10, further comprising:

performing a fourth CMP step to the metal layer, the lamination structure, and the dielectric layer after the third CMP step.

15. The manufacturing method of the semiconductor structure according to claim 14, wherein the metal layer located above the second region is partially removed by the fourth CMP step, and a top surface of the metal layer located above the second region after the fourth CMP step is higher than a top surface of the lamination structure located above the second region after the fourth CMP step in the vertical direction.

16. The manufacturing method of the semiconductor structure according to claim 15, wherein the top surface of the metal layer located above the second region after the fourth CMP step comprises a convex surface.

17. The manufacturing method of the semiconductor structure according to claim 14, wherein a removing rate of the metal layer in the fourth CMP step is lower than a removing rate of an oxide material in the fourth CMP step.

18. The manufacturing method of the semiconductor structure according to claim 17, wherein a ratio of the removing rate of the metal layer in the fourth CMP step to the removing rate of the oxide material in the fourth CMP step ranges from 0.2:1 to 0.8:1.

19. The manufacturing method of the semiconductor structure according to claim 1, wherein the metal layer comprises tungsten or copper.

20. The manufacturing method of the semiconductor structure according to claim 1, wherein a thickness of the oxide layer ranges from 50 angstroms to 100 angstroms.

* * * * *